United States Patent
Tohyama

[19]
[11] Patent Number: 5,907,767
[45] Date of Patent: May 25, 1999

[54] BACKSIDE-ILLUMINATED CHARGE-COUPLED DEVICE IMAGER AND METHOD FOR MAKING THE SAME

[75] Inventor: Shigeru Tohyama, Tokyo, Japan

[73] Assignee: NEC Corporation, Tokyo, Japan

[21] Appl. No.: 08/872,740

[22] Filed: Jun. 11, 1997

[30] Foreign Application Priority Data

Jun. 11, 1996 [JP] Japan ................................. 8-148981

[51] Int. Cl.⁶ .................................................. H01L 27/148
[52] U.S. Cl. ............................. 438/75; 438/60; 438/787; 438/960; 117/59
[58] Field of Search ................................. 438/60, 75, 466, 438/745, 746, 787, 960; 117/59

[56] References Cited

U.S. PATENT DOCUMENTS 5,433,168  7/1995  Yonehara .

FOREIGN PATENT DOCUMENTS

| 53-142193 | 12/1978 | Japan . |
| 4-212409 | 8/1992 | Japan . |
| 4-241414 | 8/1992 | Japan . |
| 5-152551 | 6/1993 | Japan . |
| 6-163968 | 6/1994 | Japan . |

OTHER PUBLICATIONS

S.R. Shortes et al., "Characteristics of thinned backside–illuminated charge–coupled device imagers", *Applied Physics Letters*, vol. 24, No. 11, Jun. 1, 1974, pp. 565–567.

G. A. Antcliffe et al, "A Backside Illuminated 400×400 Charge–Couple Device", *IEEE Transactions on Electron Devices*, vol. D–23, No. 11, Nov. 1976, pp. 1225–1232.

Primary Examiner—Charles Bowers
Assistant Examiner—Keith Christianson
Attorney, Agent, or Firm—Sughrue, Mion, Zinn, Macpeak & Seas, PLLC

[57] ABSTRACT

Disclosed is a backside-illuminated charge-coupled device imager, which has: a silicon substrate which includes a light-receiving region which is formed on the frontside of the silicon substrate and includes charge-coupled devices which are arranged one-dimensionally or two-dimensionally and has a thickness equal to or less than a pixel pitch, wherein light is supplied from the backside of the silicon substrate; wherein the light-receiving region of the silicon substrate is provided with a silicon layer with a thickness equal to or less than the pixel pitch and a silicon dioxide ($SiO_2$) layer thicker than the silicon layer.

8 Claims, 2 Drawing Sheets

6 LOW-CONCENTRATION p-TYPE EPITAXIAL Si LAYER
5 HIGH-CONCENTRATION p-TYPE BULK Si MONOCRYSTALLINE SUBSTRATE

1 LIGHT-RECEIVING REGION

7 SILICON NITRIDE FILM MASK

8 ALUMINUM FILM
9 POROUS Si

3 SiO₂

BACKSIDE-ILLUMINATED CHARGE-COUPLED DEVICE IMAGER AND METHOD FOR MAKING THE SAME

FIELD OF THE INVENTION

This invention relates to a backside-illuminated charge-coupled device imager used in the visible light region and a method for making the same.

BACKGROUND OF THE INVENTION

A conventional backside-illuminated charge-coupled device imager, which is used in the visible light region and arranged one-dimensionally, is reported by S. R. Shortes et al., "Characteristics of Thinned Backside-Illuminated Charge-Coupled Device Imagers", Appl. Phys. Lett., Vol.24, No.11, pp.565–567, 1974. Also, a conventional backside-illuminated charge-coupled device imager, which is arranged two-dimensionally, is reported by G. A. Antcliffe et al., "A Backside Illuminated 400×400 Charge-Coupled Device Imager", IEEE Trans. Electron Devices, Vol.ED-23, pp.1225–1232, 1976.

In the conventional backside-illuminated charge-coupled device imager, a light-receiving region where charge-coupled devices (CCD's) are arranged one-dimensionally or two-dimensionally is formed on the front surface of a Si monocrystalline substrate. Part of the backside of the Si monocrystalline substrate corresponding to the light-receiving region is removed by etching to a thickness equal to or less than the pixel pitch, where isotropic etching with potassium hydroxide (KOH) solution or hydrazine is used.

On the other hand, Japanese patent application laid-open No.4-241414 (1992) discloses a method for forming a semiconductor substrate, where a conventional method for making a frontside-illuminated charge-coupled device imager is used, and by which a backside-illuminated charge-coupled device imager of the invention may be fabricated.

The method for forming a semiconductor substrate disclosed in Japanese patent application laid-open No.4-241414 (1992) is as follows:

First, a p-type or high-concentration n-type Si monocrystalline substrate (bulk Si substrate) is changed into a porous Si substrate by using an anodization method with hydrofluoric acid (HF) solution from the backside. Next, on the porous Si substrate, an epitaxial growth method at a low temperature, such as molecular beam epitaxy, plasma CVD, photo-CVD and bias sputtering, is conducted. In this Si epitaxial growth, the Si monocrystalline layer includes a number of defects and dislocations near the interface to the porous Si substrate (several thousand Å from the interface) since the porous Si substrate is used. Thereafter, by thermal oxidation, the entire porous Si substrate is changed into $SiO_2$ and the region including the defects and dislocations in the epitaxial Si monocrystalline layer is also changed into $SiO_2$. As a result, the semiconductor substrate where the monocrystalline Si layer is formed on a base material of light-transmitting insulator.

However, in the conventional backside-illuminated charge-coupled device imager, there are problems that the thinned light-receiving region can be deformed unevenly due to a residual stress by the oxidation film or poly-Si electrode composing CCD and that its mechanical strength is lowered.

On the other hand, in the conventional fabrication method where the backside of the Si substrate is thinned by anisotropic etching, there is a problem that it is very difficult to obtain a thickness equal to or less than the pixel pitch, which is considerably smaller than that to be removed by the anisotropic etching, within a small dispersion.

Furthermore, in the conventional method for forming the semiconductor substrate disclosed in Japanese patent application laid-open No.4-241414(1992), there are problems as mentioned below. This method describes that a good crystallization of the monocrystalline Si layer formed on the base material of light-transmitting insulator can be obtained. However, in this method, the monocrystalline Si layer is epitaxially grown on the porous Si substrate, and then the region in the epitaxial Si monocrystalline layer which includes a number of defects and dislocations near the interface of the epitaxial Si monocrystalline layer and the porous Si substrate is changed into $SiO_2$ to decrease the defects and dislocations. Therefore, a residual stress must be applied to this region since there occurs a volumetric expansion of 2.2 times when several thousand Å of Si near the interface where a number of defects and dislocations are included is changed into $SiO_2$. Also, it is impossible to completely accommodate so many defects and dislocations in $SiO_2$. A part of them moves pushed by the oxidation-proceeding interface and will remain at the final $Si/SiO_2$ interface.

In backside-illuminated charge-coupled device imagers, though the entire Si substrate with a thickness equal to or less than the pixel pitch of the light-receiving region contributes to opto-electric conversion, especially the contribution of the backside which is an incidence surface of light is important. If there are many defects at the $Si/SiO_2$ interface which is the incidence surface of light, photoelectrically-produced carriers will be lost and a dark current due to thermal excitation will be increased. Therefore, a high-performance backside-illuminated charge-coupled device imager cannot be produced by the conventional method.

SUMMARY OF THE INVENTION

Accordingly, it is an object of the invention to provide a backside-illuminated charge-coupled device imager which has a light-receiving region with an improved planeness, mechanical strength and reliability.

It is a further object of the invention to provide a method for making such a backside-illuminated charge-coupled device imager.

According to the invention, a backside-illuminated charge-coupled device imager, comprises:

a silicon substrate which includes a light-receiving region which is formed on the frontside of the silicon substrate and includes charge-coupled devices which are arranged one-dimensionally or two-dimensionally and has a thickness equal to or less than a pixel pitch, wherein light is supplied from the backside of the silicon substrate;

wherein the light-receiving region of the silicon substrate is provided with a silicon layer with a thickness equal to or less than the pixel pitch and a silicon dioxide ($SiO_2$) layer thicker than the silicon layer.

In the backside-illuminated charge-coupled device imager of the invention, since the light-receiving region of the silicon substrate is provided with the silicon layer with a thickness equal to or less than the pixel pitch and the silicon dioxide ($SiO_2$) layer thicker than the silicon layer, deformation can be prevented by the silicon dioxide layer thicker than the silicon layer even when the residual stress of the oxidation film or poly-silicon electrode composing the charge-coupled devices is applied to the silicon layer with a thickness equal to or less than the pixel pitch. Also, the mechanical strength can be significantly enhanced as compared with the case that only a silicon layer with a thickness equal to or less than the pixel pitch is provided.

According to another aspect of the invention, a method for making a backside-illuminated charge-coupled device imager which comprises a silicon substrate which includes a light-receiving region which is formed on the frontside of the silicon substrate and includes charge-coupled devices which are arranged one-dimensionally or two-dimensionally and has a thickness equal to or less than a pixel pitch, wherein light is supplied from the backside of the silicon substrate, comprises the steps of:

forming an epitaxial silicon layer with a thickness equal to or less than the pixel pitch on a bulk silicon monocrystalline substrate;

forming the charge-coupled devices to be arranged one-dimensionally or two-dimensionally;

changing part of the bulk silicon monocrystalline substrate which corresponds to the light-receiving region into a porous state; and oxidizing the porous part of the bulk silicon monocrystalline substrate to give a silicon dioxide ($SiO_2$) layer;

wherein the light-receiving region of the silicon substrate is provided with a silicon layer with a thickness equal to or less than the pixel pitch and the silicon dioxide ($SiO_2$) layer thicker than the silicon layer.

In the method of the invention, the epitaxial silicon layer with a thickness equal to or less than the pixel pitch is first formed on the bulk silicon monocrystalline substrate. Namely, silicon is not epitaxially grown on a porous silicon substrate but epitaxially grown on the bulk silicon monocrystalline substrate with a high crystallinity. Therefore, the epitaxial silicon layer with a high crystallinity can be formed near the interface of the bulk silicon monocrystalline substrate and the epitaxial silicon layer.

Thereafter, functional elements such as CCD's to be arranged one-dimensionally or two-dimensionally is formed, part of the bulk silicon monocrystalline substrate which corresponds to the light-receiving region is changed into a porous state, and the porous part of the bulk silicon monocrystalline substrate is oxidized to give a silicon dioxide ($SiO_2$) layer. Thereby, the light-receiving region of the silicon substrate can be provided with a silicon layer with a thickness equal to or less than the pixel pitch and the silicon dioxide ($SiO_2$) layer thicker than the silicon layer, and a backside-illuminated charge-coupled device imager which does not includes defects at the $Si/SiO_2$ interface can be obtained.

Meanwhile, any one of combinations of materials 1) to 4) below can be optionally used when the epitaxial layer with a thickness equal to or less than the pixel pitch is formed the bulk silicon monocrystalline substrate.

1) A low-concentration p-type epitaxial silicon layer with a thickness equal to or less than the pixel pitch is formed on a high-concentration p-type bulk silicon monocrystalline substrate.

2) A n-type epitaxial silicon layer with a thickness equal to or less than the pixel pitch is formed on a p-type bulk silicon monocrystalline substrate.

3) A p-type epitaxial silicon layer with a thickness equal to or less than the pixel pitch is formed on a high-concentration n-type bulk silicon monocrystalline substrate.

4) A low-concentration n-type epitaxial silicon layer with a thickness equal to or less than the pixel pitch is formed on a high-concentration n-type bulk silicon monocrystalline substrate.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a backside-illuminated charge-coupled device imager in the preferred embodiment, the aforementioned conventional backside-illuminated charge-coupled device imager will be explained in FIG. 1.

Figure 1:
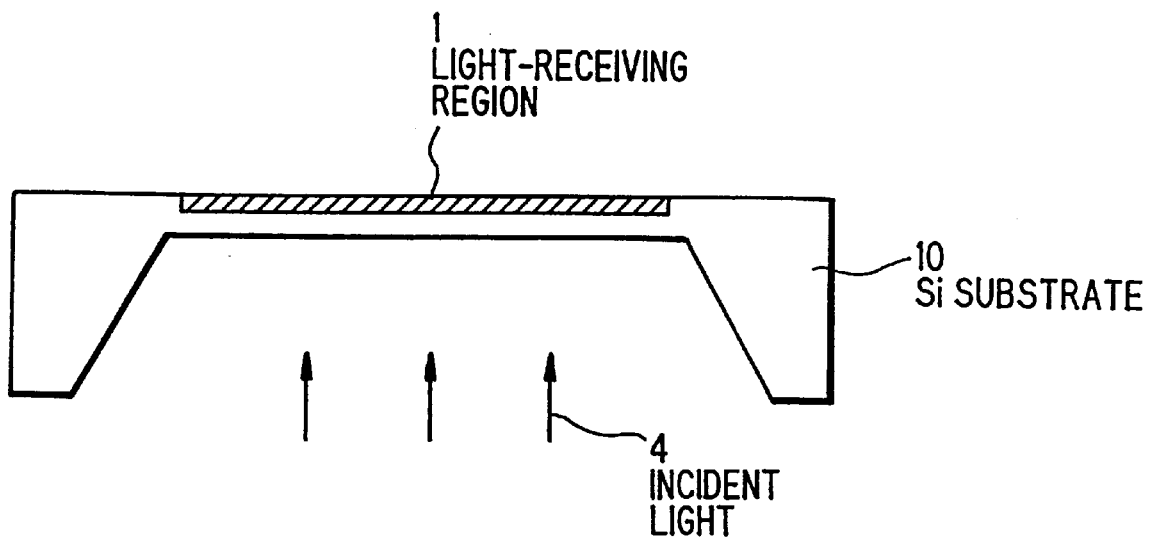
FIG. 1 is a cross sectional view showing the composition of a conventional backside-illuminated charge-coupled device imager.

In FIG. 1, a light-receiving region 1 where charge-coupled devices (CCD's) are arranged one-dimensionally or two-dimensionally is formed on the front surface of a Si monocrystalline substrate 10. Part of the backside of the Si monocrystalline substrate 10 corresponding to the light-receiving region 1 is removed by etching to a thickness equal to or less than the pixel pitch. An incident light 4 is supplied from the backside of the Si monocrystalline substrate 10.

Next, a backside-illuminated charge-coupled device imager in the preferred embodiment of the invention will be explained in FIG. 2, wherein like parts are indicated by like reference numerals as used in FIG. 1.

Figure 2:
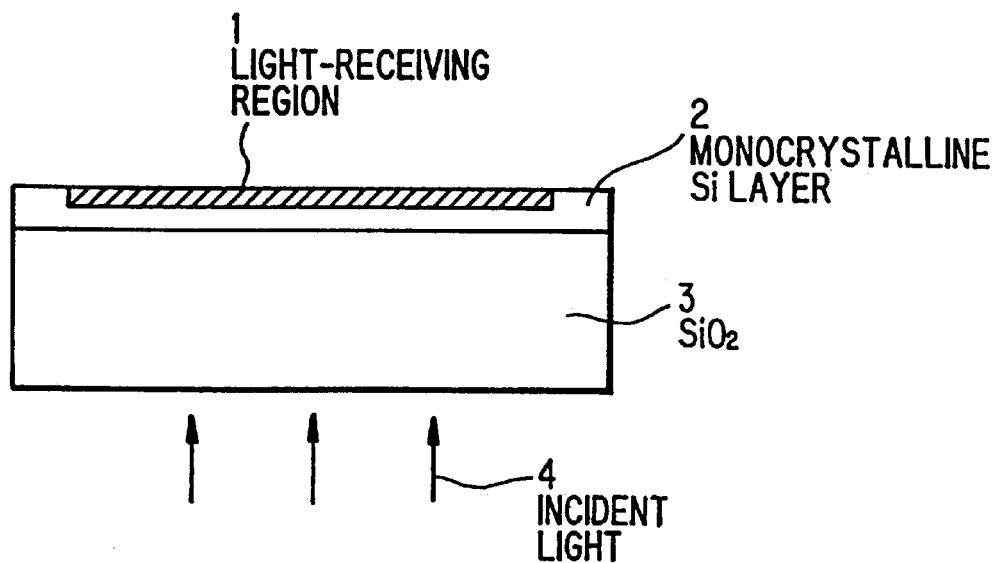
FIG. 2 is a cross sectional view showing main part of a backside-illuminated charge-coupled device imager in a preferred embodiment according to the invention.

FIG. 2 is a cross sectional view showing main part of the backside-illuminated charge-coupled device imager in the embodiment. In FIG. 2, a light-receiving region 1 has charge-coupled devices (CCD's) which are arranged one-dimensionally or two-dimensionally. A monocrystalline Si layer 2 has a thickness equal to or less than the pixel pitch. A $SiO_2$ layer 3 has a thickness greater than that of the monocrystalline Si layer 2. The light-receiving region 1 is provided on the frontside of the monocrystalline Si layer 2. Since the $SiO_2$ layer 3 has a large transmittance factor to a visible region light, an incident light can be supplied from the backside of the $SiO_2$ layer 3 to the light-receiving region 1. Since the monocrystalline Si layer 2 is reinforced with the $SiO_2$ layer 3 much thicker than the monocrystalline Si layer 2, deformation due to a residual stress by the oxidation film or poly-Si electrode composing CCD can be prevented. Therefore, the mechanical strength of the backside-illuminated charge-coupled device imager in the embodiment is very high. Besides, by providing the incidence surface (backside) of the $SiO_2$ layer 3 with an anti-reflection coating film, light reflection on the incidence surface of the $SiO_2$ layer 3 can be reduced to further increase the sensitivity.

Figure 3A:
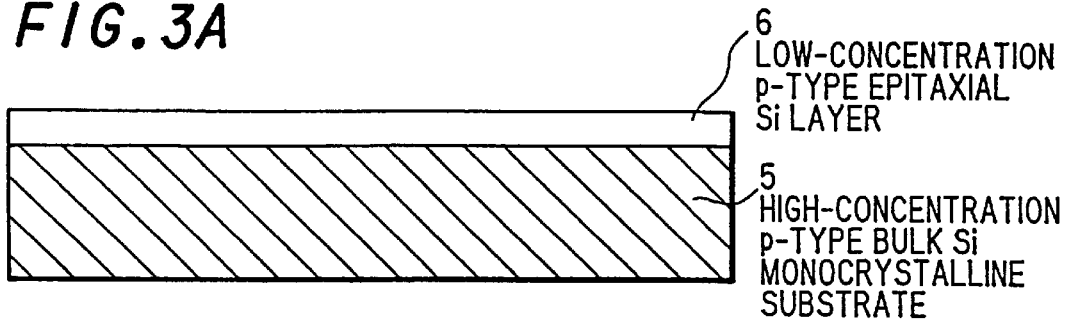
FIGS. 3A to 3E are cross sectional views showing a method for making a backside-illuminated charge-coupled device imager in a preferred embodiment according to the invention.

FIGS. 3A to 3E show a method for making a backside-illuminated charge-coupled device imager in the preferred embodiment of the invention. First, as shown in FIG. 3A, a low-concentration p-type epitaxial Si layer 6 with a thickness equal to or less than the pixel pitch is formed on a high-concentration p-type bulk Si monocrystalline substrate 5. Though, in this embodiment, the high-concentration p-type bulk Si monocrystalline substrate 5 and the low-concentration p-type editaxial Si layer 6 are used, any one of combinations of materials 1) to 3) below may be used.

1) A n-type epitaxial Si layer with a thickness equal to or less than the pixel pitch is formed on a p-type bulk Si monocrystalline substrate.

2) A p-type epitaxial Si layer with a thickness equal to or less than the pixel pitch is formed on a high-concentration n-type bulk Si monocrystalline substrate.

3) A low-concentration n-type epitaxial Si layer with a thickness equal to or less than the pixel pitch is formed on a high-concentration n-type bulk Si monocrystalline substrate.

The differences in impurity concentration and conductivity type between the bulk Si monocrystalline substrate and the epitaxial Si layer are given to surely stop the formation of pores at the interface between the bulk Si monocrystalline substrate and the eptaxial Si layer when the bulk Si monocrystalline substrate is changed into a porous state on a later step.

Figure 3B:
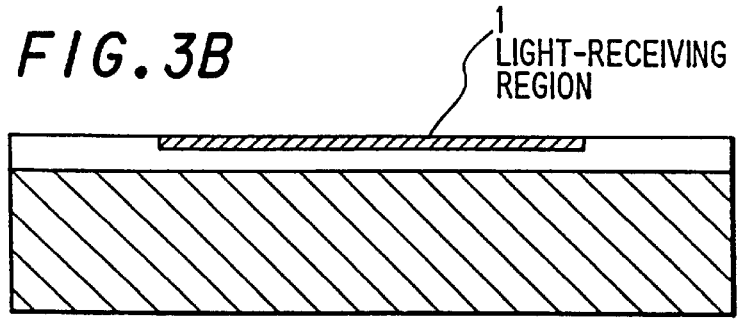

Then, as shown in FIG. 3B, in the low-concentration p-type epitaxial Si layer 6, the light-receiving region 1 where CCD's are arranged and the other functional elements necessary for the backside-illuminated charge-coupled device imager are formed. Though not shown, a protective film such as Si oxidation film covers the functional elements such as the light-receiving region 1.

Figure 3C:
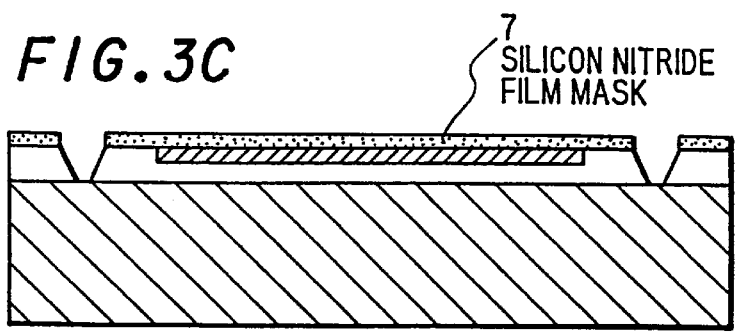

Then, as shown in FIG. 3C, a silicon nitride film mask 7 is formed thereon to prevent the oxidation of the light-receiving region 1 etc. on a later oxidation step. Thereafter, the low-concentration p-type epitaxial Si layer 6 in a scribing line region is removed by etching up to the high-concentration p-type bulk Si substrate 5.

Figure 3D:
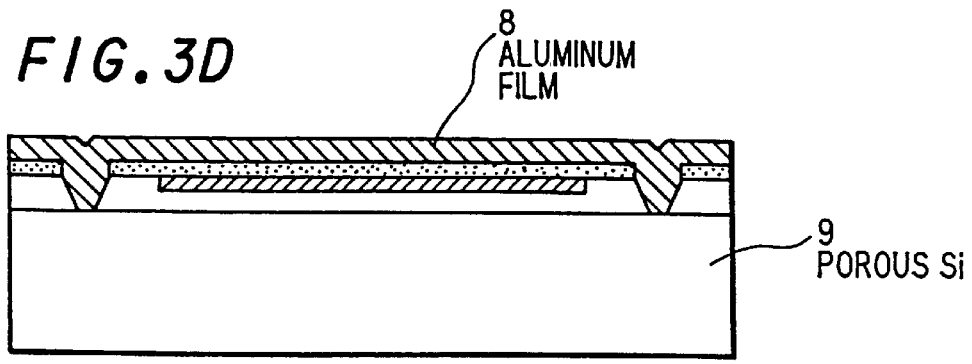

Thereafter, as shown in FIG. 3D, an aluminum film 8 is formed to apply a uniform potential to the high-concentration p-type bulk Si substrate 5, and then the high-concentration p-type bulk Si substrate 5 is changed into a state of porous Si 9 by using an anodization method with hydrofluoric acid (HF) solution with a concentration of around 20 to 50%. If, in this anodization process, the density of porous Si 9 to the high-concentration p-type bulk Si substrate 5 is controlled to be around 45%, all the pores can be buried when the porous Si 9 is changed into $SiO_2$. Therefore, the residual stress can be almost reduced to zero.

If the final thickness of the backside-illuminated charge-coupled device imager requires to be less than the initial thickness of the high-concentration p-type bulk Si substrate 5, the backside may be polished before the anodization process. Thereby the time required to the anodization process can be reduced.

Furthermore, if a silicon nitride film mask (not shown) is formed on a region except under the light-receiving region 1 of the backside of the high-concentration p-type bulk Si substrate 5, only a region including under the light-receiving region 1, i.e., a region that is not covered with the silicon nitride film mask and a region that is extended under the silicon nitride film mask up to around the thickness of the high-concentration p-type bulk Si substrate 5, can be changed into a porous state.

Figure 3E:
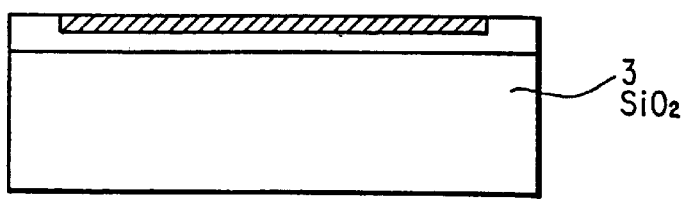

Then, as shown in FIG. 3E, the aluminum film 8 is removed, and then the entire porous Si 9 is changed into $SiO_2$ 3 by oxidation at a relatively low temperature as explained below. Finally, the silicon nitride film mask 7 is removed.

The thermal oxidation process for changing the porous Si 9 into $SiO_2$ 3 is conducted at a temperature of 500 to 600° C. when aluminum is used as a wiring material in the backside-illuminated charge-coupled device imager. When copper, gold, molybdenum or tungsten with a melting point higher than that of aluminum is used as the wiring material, the oxidation may be conducted at a temperature increased up to around 800° C. Also, if a wiring-forming process is conducted after the oxidation process of the porous Si 9, the oxidation process can be conducted at a high temperature up to around 1000° C.

In the method for making a backside-illuminated charge-coupled device imager in the embodiment, the conventional technology with high difficulty where the backside of the Si substrate is etched by the anisotropic etching to give a thickness equal to or less than the pixel pitch within a small dispersion is not necessary. Also, there is no defect at the final $Si/SiO_2$ interface since the monocrystalline Si layer finally obtained is epitaxially grown on the bulk Si monocrystalline substrate with a high crystallinity.

EXAMPLE

The backside-illuminated charge-coupled device imager and the method of making the same in the embodiment will be detailed in an example below, where a low-concentration p-type epitaxial Si layer with a thickness equal to or less than the pixel pitch is formed on a high-concentration p-type bulk Si monocrystalline substrate.

A p-type epitaxial Si layer with a thickness of 10 $\mu$m and a resistivity of around 30 $\Omega$cm is formed on a p-type (100) bulk Si substrate with a thickness of 400 $\mu$m and a resistivity of around 1 $\Omega$cm, and a standard process for fabricating CCD is then conducted, where tungsten is used as a wiring material.

After forming functional elements such as a light-receiving region where CCD's are arranged, a silicon nitride film mask with a thickness of around 1000 Å is formed thereon. A silicon nitride film mask is also formed on the backside of the Si substrate. Since a Si oxidation film formed when the functional elements are formed remains on the backside of the Si substrate, the silicon nitride film does not directly contact the backside of the Si substrate. By using the pattern of the silicon nitride film mask, the silicon oxidation film etc. at the scribing line is removed and the p-type epitaxial Si layer is etched by anisotropic etching with hydrazine. Then, the silicon nitride film on the backside of the Si substrate is removed by etching while protecting the frontside with a Si oxidation film with a thickness of around 2000 Å, and then the Si oxidation films on both sides of the Si substrate are removed by etching. In this case, the bulk Si substrate completely is exposed especially at the scribing line region and at the back surface of the Si substrate.

An aluminum film with a thickness of around 3 $\mu$m is formed on the frontside, and then the p-type (100) bulk Si substrate is changed into a porous state by using anodization method, where the hydrofluoric (HF) solution has a concentration of 40% and the current density is 100 mA/cm$^2$. The formation of porous Si is proceeded at the rate of around 7 $\mu$m/min. and the density is reduced to around 45%.

Then, the aluminum film is removed by etching, and wet thermal oxidation is conducted at 700° C. for 12 hours to change all the porous Si into $SiO_2$. Though the silicon nitride film for preventing oxidation can be removed, it may be used as a passivation film while opening only part of bonding pad.

In case of using a n-type bulk Si monocrystalline substrate, a n-type bulk Si substrate with a resistivity of around 0.01 $\Omega$cm is adopted since the uniformity in formation of pores is improved with an increase in impurity concentration. In this case, a like process of forming porous Si can be conducted under a condition of anodization similar to that in the case of the p-type bulk Si substrate. However, since holes contributing to the anodization need to be generated in the Si substrate, it is required to radiate light of a xenon lamp. The other steps are the same as those in the case of the p-type bulk Si substrate.

Using the above method, a backside-illuminated charge-coupled device imager which has a light-receiving region with an improved planeness, mechanical strength and reliability can be obtained.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A backside-illuminated charge-coupled device imager, comprising:

a silicon substrate which includes a light-receiving region which is formed on the frontside of said silicon substrate and includes charge-coupled devices which are arranged one-dimensionally or two-dimensionally and has a thickness equal to or less than a pixel pitch, wherein light is supplied from the backside of said silicon substrate;

wherein said light-receiving region of said silicon substrate is provided with a first silicon layer with a thickness equal to or less than said pixel pitch and a silicon dioxide (SiO$_2$) layer thicker than said silicon layer and;

wherein said silicon dioxide layer (SiO$_2$) is a layer which is formed after the formation of said light-receiving region.

2. A method for making a backside-illuminated charge-coupled device imager which comprises a silicon substrate which includes a light-receiving region which is formed on the frontside of said silicon substrate and includes charge-coupled devices which are arranged one-dimensionally or two-dimensionally and has a thickness equal to or less than a pixel pitch, wherein light is supplied from the backside of said silicon substrate, comprising the steps of:

forming an epitaxial silicon layer with a thickness equal to or less than said pixel pitch on a bulk silicon monocrystalline substrate;

forming said charge-coupled devices to be arranged one-dimensionally or two-dimensionally;

forming an aperture reaching the bulk silicon monocrystalline substrate by removing the epitaxial silicon layer at the scribing line region;

providing a metal film on the entire top surface of the substrate;

changing part of said bulk silicon monocrystalline substrate which corresponds to said light-receiving region into a porous state; and oxidizing said porous part of said bulk silicon monocrystalline substrate to give a silicon dioxide (SiO$_2$) layer;

wherein said light-receiving region of said silicon substrate is provided with a silicon layer with a thickness equal to or less than said pixel pitch and said silicon dioxide (SiO$_2$) layer thicker than said silicon layer.

3. A method for making a backside-illuminated charge-coupled device imager, according to claim 2, wherein:

said bulk silicon monocrystalline substrate is a high-concentration p-type bulk silicon monocrystalline substrate, and said epitaxial silicon layer is a low-concentration p-type epitaxial silicon layer.

4. A method for making a backside-illuminated charge-coupled device imager, according to claim 2, wherein:

said bulk silicon monocrystalline substrate is a p-type bulk silicon monocrystalline substrate, and said epitaxial silicon layer is a n-type epitaxial silicon layer.

5. A method for making a backside-illuminated charge-coupled device imager, according to claim 2, wherein:

said bulk silicon monocrystalline substrate is a high-concentration n-type bulk silicon monocrystalline substrate, and said epitaxial silicon layer is a p-type epitaxial silicon layer.

6. A method for making a backside-illuminated charge-coupled device imager, according to claim 2, wherein:

said bulk silicon monocrystalline substrate is a high-concentration n-type bulk silicon monocrystalline substrate, and said epitaxial silicon layer is a low-concentration n-type epitaxial silicon layer.

7. A backside-illuminated charge-coupled device imager, according to claim 1, further comprising:

a non-light-receiving region surrounding said light-receiving region, said non-light-receiving region comprising a second silicon layer with a thickness equal to or less than said pixel pitch, and a bulk silicon substrate thicker than said silicon layer.

8. A method for making a backside-illuminated charge-coupled device imager, according to claim 2, wherein said metal film is an aluminum film.

* * * * *